(12) United States Patent
Narita

(10) Patent No.: US 10,151,800 B2
(45) Date of Patent: Dec. 11, 2018

(54) SUPPLY-VOLTAGE-FLUCTUATION DETECTING APPARATUS AND PROCESSING SYSTEM

(71) Applicant: Alpine Electronics, Inc., Shinagawa-ku, Tokyo (JP)

(72) Inventor: Koichi Narita, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 37 days.

(21) Appl. No.: 15/352,713

(22) Filed: Nov. 16, 2016

(65) Prior Publication Data

US 2017/0199243 A1    Jul. 13, 2017

(30) Foreign Application Priority Data

Jan. 12, 2016    (JP) ................................. 2016-003248

(51) Int. Cl.

| | | |
|---|---|---|
| *G01R 31/36* | (2006.01) |
| *G01R 31/00* | (2006.01) |
| *G05D 1/02* | (2006.01) |
| *G01R 31/40* | (2014.01) |
| *G05F 1/00* | (2006.01) |
| *B60R 16/03* | (2006.01) |

(52) U.S. Cl.
CPC ......... *G01R 31/362* (2013.01); *G01R 31/007* (2013.01); *G01R 31/40* (2013.01); *G05D 1/021* (2013.01); *G05F 1/00* (2013.01); *B60R 16/03* (2013.01); *G01R 31/006* (2013.01)

(58) Field of Classification Search
CPC combination set(s) only.
See application file for complete search history.

(56) References Cited

U.S. PATENT DOCUMENTS 3,912,981 A * 10/1975 Tsurushima ............ H03F 1/523
                                                    257/264
3,918,044 A * 11/1975 Alpatoff ................. G08C 19/46
                                                    341/115

(Continued)

FOREIGN PATENT DOCUMENTS

| JP | 10-68747 | 3/1998 |
| JP | 11-211761 | 8/1999 |
| JP | 2004-348323 | 12/2004 |

*Primary Examiner* — Adam D Tissot
*Assistant Examiner* — Edward J Pipala
(74) *Attorney, Agent, or Firm* — Brinks Gilson & Lione

(57) ABSTRACT

A supply-voltage-fluctuation detecting apparatus includes a first detecting unit, a second detecting unit, a capacitor, and a fluctuation detecting unit. The first detecting unit and the second detecting unit detect fluctuations in voltage at a detected voltage input with respect to a detected ground input. A load unit that operates with power supplied from a battery and the first detecting unit are connected in parallel. A detected voltage input of the second detecting unit connects to a positive electrode of the battery. A detected ground input of the second detecting unit connects to a detected ground input of the first detecting unit via an impedance component. The capacitor is connected in parallel to the second detecting unit. The fluctuation detecting unit detects fluctuations in supply voltage when at least one of the first detecting unit or the second detecting unit detects fluctuations in voltage.

10 Claims, 6 Drawing Sheets

(56) References Cited

U.S. PATENT DOCUMENTS

| | | | | |
|---|---|---|---|---|
| 3,968,382 | A | * | 7/1976 | Tsurushima .............. G01H 1/04 |
| | | | | 257/264 |
| 4,890,233 | A | * | 12/1989 | Ando ..................... G01C 21/08 |
| | | | | 318/587 |
| 2001/0030557 | A1 | * | 10/2001 | Niimi .................. H03K 17/063 |
| | | | | 327/108 |
| 2005/0128127 | A1 | * | 6/2005 | Tevs .......................... G01S 7/03 |
| | | | | 342/28 |
| 2006/0200276 | A1 | * | 9/2006 | Sayama ................. H02J 9/061 |
| | | | | 701/1 |
| 2007/0145950 | A1 | * | 6/2007 | Wang ....................... H02J 1/14 |
| | | | | 320/134 |
| 2012/0025805 | A1 | | 2/2012 | Matsushita et al. |
| 2014/0132072 | A1 | * | 5/2014 | Hatori ...................... H02J 4/00 |
| | | | | 307/52 |
| 2014/0145707 | A1 | | 5/2014 | Tanabe et al. |
| 2017/0294791 | A1 | * | 10/2017 | Mito .................... H02J 7/0029 |

* cited by examiner

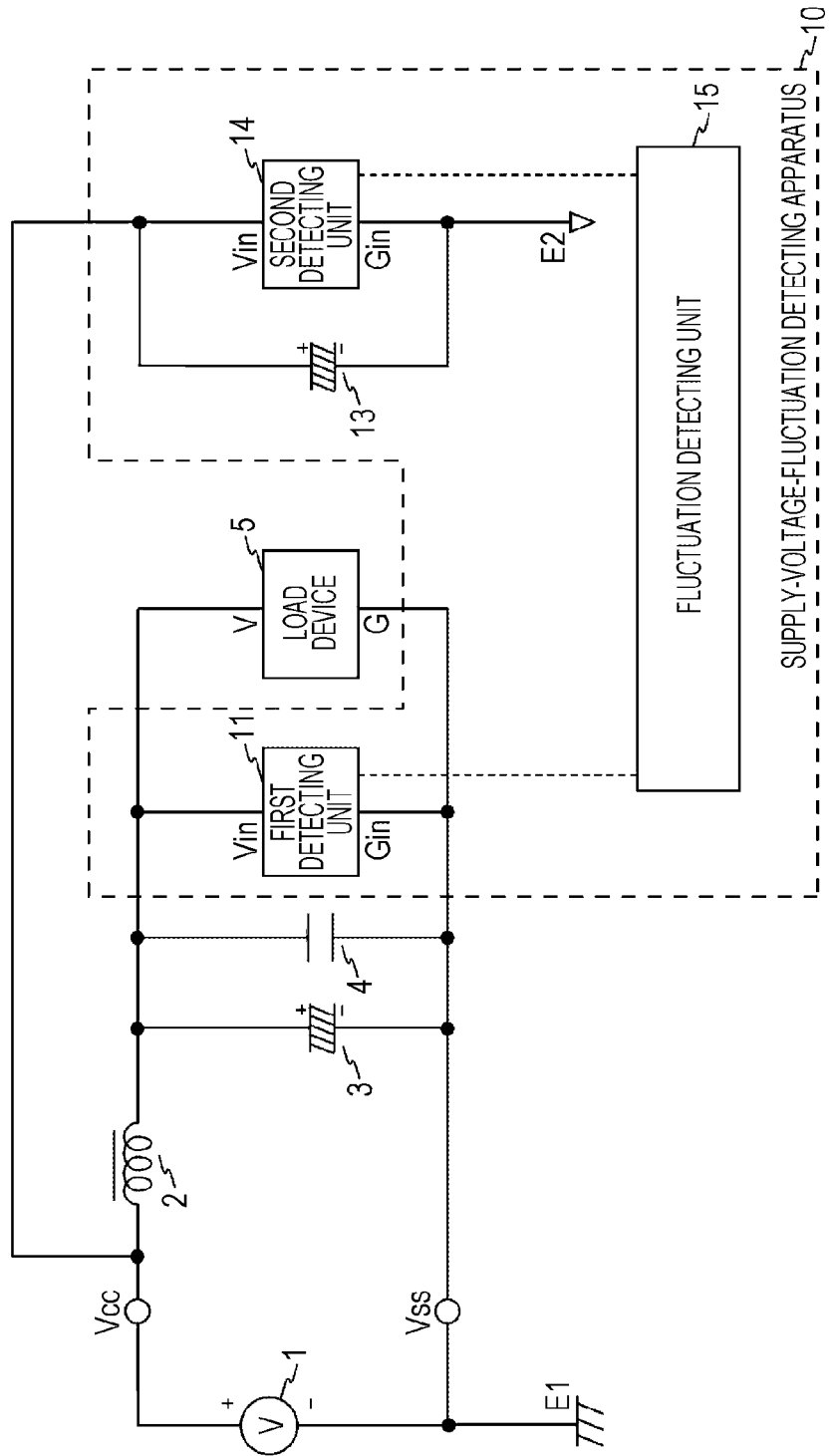

SUPPLY-VOLTAGE-FLUCTUATION DETECTING APPARATUS AND PROCESSING SYSTEM

RELATED APPLICATIONS

The present application claims priority to Japanese Patent Appln. No. 2016-003248, filed Jan. 12, 2016, the entirety of which is hereby incorporated by reference.

BACKGROUND

1. Field of the Disclosure

The present disclosure relates to a technique for detecting fluctuations in supply voltage.

2. Description of the Related Art

Known examples of techniques for detecting fluctuations in supply voltage include a technique for detecting fluctuations in supply voltage with respect to ground potential by comparing the supply voltage with a predetermined reference voltage (for example, Japanese Unexamined Patent Application Publication No. 11-211761, No. 2012-32254, No. 2004-348323, and No. 10-68747) and a technique for detecting fluctuations in supply voltage with respect to ground potential from changes in oscillation frequency of an oscillating circuit driven with the supply voltage (for example, Japanese Unexamined Patent Application Publication No. 2014-106112).

Since the above techniques are for detecting fluctuations in supply voltage with respect to ground potential, fluctuations in supply voltage concurrent with and similar to the ground potential cannot be detected.

For an apparatus that is significantly influenced by fluctuations in supply voltage concurrent with and similar to ground potential, it is preferable to also detect such fluctuations to reduce or eliminate malfunction of the apparatus.

SUMMARY

Accordingly, the present disclosure provides a supply-voltage-fluctuation detecting apparatus capable of also detecting fluctuations in supply voltage concurrent with and similar to ground potential.

According to a first aspect of the present disclosure, a supply-voltage-fluctuation detecting apparatus that detects fluctuations in voltage supplied from a power supply is provided. The apparatus includes a first detecting unit, a second detecting unit, an impedance component, a capacitor, and a fluctuation detecting unit. The first detecting unit includes a positive input and a negative input and is configured to detect fluctuations in voltage between the positive input and the negative input. The second detecting unit includes a positive input and a negative input and is configured to detect fluctuations in voltage between the positive input and the negative input. The capacitor is configured to smooth the voltage between the positive input and the negative input of the second detecting unit. The fluctuation detecting unit is configured, when at least one of the first detecting unit or the second detecting unit detects fluctuations in voltage, to detect fluctuations in the supply voltage. A positive electrode voltage supplied from the power supply is applied to the positive input of the first detecting unit and the positive input of the second detecting unit. A negative electrode voltage supplied from the power supply is applied to the negative input of the first detecting unit. The negative input of the first detecting unit and the negative input of the second detecting unit are connected to each other via the impedance component.

In the above supply-voltage-fluctuation detecting apparatus, a negative electrode of the power supply may connect to a first grounding point, and the negative input of the second detecting unit may connect to a second grounding point. The first grounding point and the second grounding point are separate different points of an electrical conductor.

In the above supply-voltage-fluctuation detecting apparatus, when both of the first detecting unit and the second detecting unit detect fluctuations in voltage, the fluctuation detecting unit may detect fluctuations in the positive electrode voltage supplied from the power supply with respect to the negative electrode voltage supplied from the power supply, and when only one of the first detecting unit or the second detecting unit detects fluctuations in voltage, the fluctuation detecting unit may detect fluctuations in both of the positive electrode voltage supplied from the power supply and the negative electrode voltage supplied from the power supply.

According to a second aspect of the present disclosure, a supply-voltage-fluctuation detecting apparatus that detects fluctuations in voltage supplied from a power supply is provided. The apparatus includes a first detecting unit, a second detecting unit, a capacitor, and a fluctuation detecting unit. The first detecting unit includes a positive input and a negative input and is configured to detect fluctuations in voltage between the positive input and the negative input. The second detecting unit includes a positive input and a negative input and is configured to detect fluctuations in voltage between the positive input and the negative input. The capacitor is configured to smooth the voltage between the positive input and the negative input of the second detecting unit. The fluctuation detecting unit is configured, when at least one of the first detecting unit or the second detecting unit detects fluctuations in voltage, to detect fluctuations in the supply voltage. A positive electrode voltage supplied from the power supply is applied to the positive input of the first detecting unit and the positive input of the second detecting unit. A negative electrode voltage supplied from the power supply is applied to the negative input of the first detecting unit. The negative electrode of the supply voltage connects to a first grounding point. The negative input of the second detecting unit connects to a second grounding point. The first grounding point and the second grounding point are separate different points of an electrical conductor having impedance.

According to a third aspect of the present disclosure, a supply-voltage-fluctuation detecting apparatus that detects fluctuations in voltage supplied from a power supply is provided. The apparatus includes a first detecting unit, a second detecting unit, an impedance component, a capacitor, and a fluctuation detecting unit. The first detecting unit includes a positive input and a negative input and is configured to detect fluctuations in voltage between the positive input and the negative input. The second detecting unit includes a positive input and a negative input and is configured to detect fluctuations in voltage between the positive input and the negative input. The capacitor is configured to smooth the voltage between the positive input and the negative input of the second detecting unit. The fluctuation detecting unit is configured, when at least one of the first detecting unit or the second detecting unit detects fluctuations in voltage, to detect fluctuations in the supply voltage. A negative electrode voltage supplied from the power supply is applied to the negative input of the first detecting unit and the negative input of the second detecting unit. A positive electrode voltage supplied from the power supply is applied to the positive input of the first detecting unit. The positive input of the first detecting unit and the positive input of the second detecting unit are connected to each other via the impedance component.

In the above supply-voltage-fluctuation detecting apparatus, a first end of the capacitor may connect to the positive input of the second detecting unit, and a second end of the capacitor may connect to the negative input of the second detecting unit.

In the supply-voltage-fluctuation detecting apparatus in which the negative input of the second detecting unit is connected to the second grounding point, the electrical conductor may be a body of an automobile.

With the supply-voltage-fluctuation detecting apparatus, the magnitude and timing of concurrent, similar fluctuations in the positive input and the negative input due to a delay in fluctuations in potential because of the impedance component and the capacitor and the difference in fluctuations in potential between the first grounding point and the second grounding point differ between the first detecting unit and the second detecting unit. Thus, detecting fluctuations in supply voltage when at least one of the first detecting unit or the second detecting unit detects fluctuations in voltage allows detecting concurrent, similar fluctuations at the positive input and the negative input, in addition to fluctuations in supply voltage at the positive electrode with respect to the negative electrode.

According to still another aspect of the present disclosure, a processing system including the supply-voltage-fluctuation detecting apparatus and a processing unit configured to operate with the power from the power supply is provided.

According to still another aspect of the present disclosure, a processing system is provided which includes the above supply-voltage-fluctuation detecting apparatus, a sensor configured to operate with power from a power supply, and a reliability calculating unit configured to calculate reliability of an output value from the sensor according whether the fluctuation detecting unit detects fluctuations in supply voltage.

According to still another aspect of the present disclosure, a processing system mounted in an automobile including the above supply-voltage-fluctuation detecting apparatus is provided. The processing system includes a sensor, a reliability calculating unit, and a current-location calculating unit. The sensor is configured to operate with power from a power supply to detect behavior of the automobile. The reliability calculating unit is configured to set low reliability to an output value from the sensor when fluctuations in supply voltage is detected according to whether the fluctuation detecting unit detects fluctuations in supply voltage. The current-location calculating unit is configured to calculate a current location of the automobile using an output value from the sensor to which low reliability is not set.

Thus, according to aspects of the present disclosure, a supply-voltage-fluctuation detecting apparatus capable of also detecting fluctuations in supply voltage concurrent with and similar to ground potential.

BRIEF DESCRIPTION OF THE DRAWINGS

FIG. 4 is a block diagram illustrating a configuration of a supply-voltage. fluctuation detecting apparatus according to another embodiment of the present disclosure;

DETAILED DESCRIPTION OF THE DRAWINGS

Figure 1:
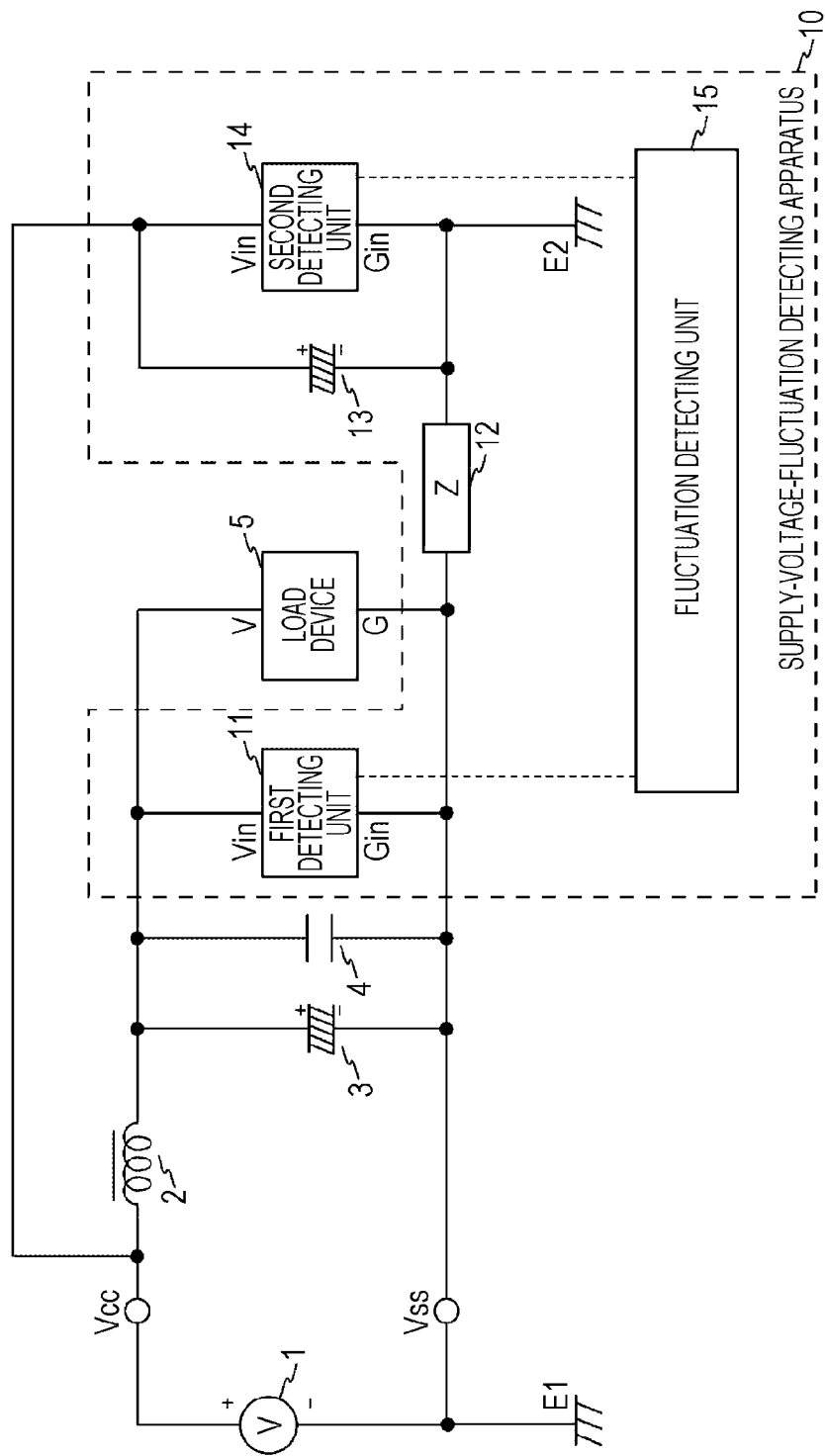
FIG. 1 is a block diagram illustrating a configuration of a supply-voltage-fluctuation detecting apparatus according to an embodiment of the present disclosure.

FIG. 1 illustrates a configuration of a supply-voltage-fluctuation detecting apparatus 10 according to an embodiment.

In FIG. 1, the supply-voltage-fluctuation detecting apparatus 10 is an apparatus that detects fluctuations in supply voltage supplied from a battery 1 to a load unit 5 via a choking coil 2, a first electrolytic capacitor 3 that smooths the supply voltage, and a capacitor 4 for removing the high-frequency noise of the supply voltage.

The positive electrode of the battery 1 connects to a power input Vcc, and the negative electrode of the battery 1 connects to a first earth E1 and a ground input Vss.

A first end of the choking coil 2 connects to the power input Vcc, and a second end of the choking coil 2 connects to the positive electrode of the first electrolytic capacitor 3, and the negative electrode of the first electrolytic capacitor 3 connects to the ground input Vss. A first end of the capacitor 4 connects to the positive electrode of the first electrolytic capacitor 3, and a second end of the capacitor 4 connects to the negative electrode of the first electrolytic capacitor 3. A power input terminal V of the load unit 5 connects to the first end of the capacitor 4. A grounding terminal G of the load unit 5 connects to the second end of the capacitor 4.

The supply-voltage-fluctuation detecting apparatus 10 includes a first detecting unit 11, an impedance component 12, a second electrolytic capacitor 13, a second detecting unit 14, and a fluctuation detecting unit 15. An example of the impedance component 12 is a resistor.

The first detecting unit 11 is disposed in parallel to the load unit 5. A detected voltage input Vin of the first detecting unit 11 connects to the power input terminal V of the load unit 5, and a detected ground input Gin of the first detecting unit 11 connects to the grounding terminal G of the load unit 5. A first end of the impedance component 12 connects to the grounding terminal G of the load unit 5. The positive electrode of the second electrolytic capacitor 13 connects to a power input Vcc, and the negative electrode of the second electrolytic capacitor 13 connects to a second end of the impedance component 12. A detected voltage input Vin of the second detecting unit 14 connects to the positive electrode of the second electrolytic capacitor 13, and a detected ground input Gin of the second detecting unit 14 connects to the negative electrode of the second electrolytic capacitor 13. The detected ground input Gin of the second detecting unit 14 also connects to a second earth E2.

The first earth E1 and the second earth E2 are connected together by an electrical conductor. An example of the electrical conductor is the body of an automobile. The first earth E1 and the second earth E2 are body grounding points for grounding different separate positions of the body of the automobile.

The first detecting unit 11 and the second detecting unit 14 detect fluctuations in voltage at the detection voltage input Vin with respect to the potential at the detected ground input Gin and output the detection result to the fluctuation detecting unit 15.

Examples of the first detecting unit 11 and the second detecting unit 14 include the apparatuses for detecting fluctuations in supply voltage with respect to the ground potential disclosed in the above-described related art.

Figure 2A:
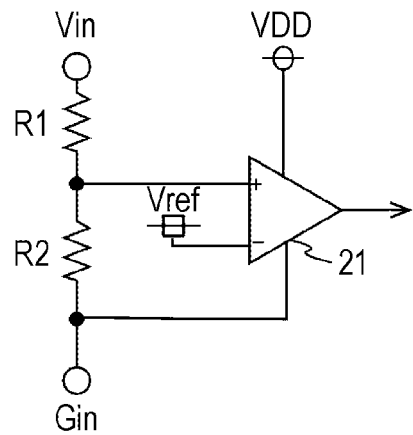
FIG. 2A is a diagram illustrating an example configuration of a first detecting unit and a second detecting unit according to an embodiment of the present disclosure.

Another example of the first detecting unit 11 and the second detecting unit 14 is a detecting circuit using a comparator 21 shown in FIG. 2A. In the detecting circuit shown in FIG. 2A, the voltage between the detected voltage input Vin and the potential at the detected ground input Gin is divided by resistors R1 and R2. The comparator 21 that operates under a stable supply voltage Vdd, which is separately generated by a regulator or the like, compares the divided voltage with a predetermined reference voltage Vref generated at a constant-voltage circuit or the like and outputs the comparison result to the fluctuation detecting unit 15.

Figure 2B:
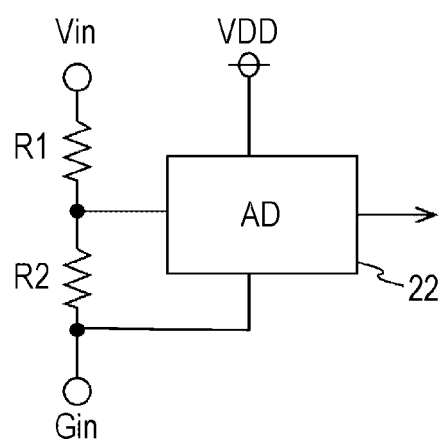
FIG. 2B is a diagram illustrating an example configuration of the first detecting unit and the second detecting unit according to an embodiment of the present disclosure.

Still another example of the first detecting unit 11 and the second detecting unit 14 is a detecting circuit using an analog-to-digital converter 22 shown in FIG. 2B. In FIG. 2A, the detecting circuit divides the voltage between the detected voltage input Vin and the potential at the detected ground input Gin using the resistors R1 and R2. The divided voltage is converted to digital values by the analog-to-digital converter 22, which operates under a stable supply voltage Vdd separately generated by a regulator or the like, and the digital values are output to the fluctuation detecting unit 15.

With this supply-voltage-fluctuation detecting unit 10, the first detecting unit 11 and the second detecting unit 14 detect fluctuations in supply voltage from the battery 1 in different forms because a delay in fluctuations in ground potential due to the impedance component 12 disposed between the detected ground input Gin of the first detecting unit 11 and the detected ground input Gin of the second detecting unit 14 and the second electrolytic capacitor 13 disposed in parallel to the second detecting unit 14 and the difference in the form of fluctuations in ground potential between the first earth E1 and the second earth E2.

Figure 3A:
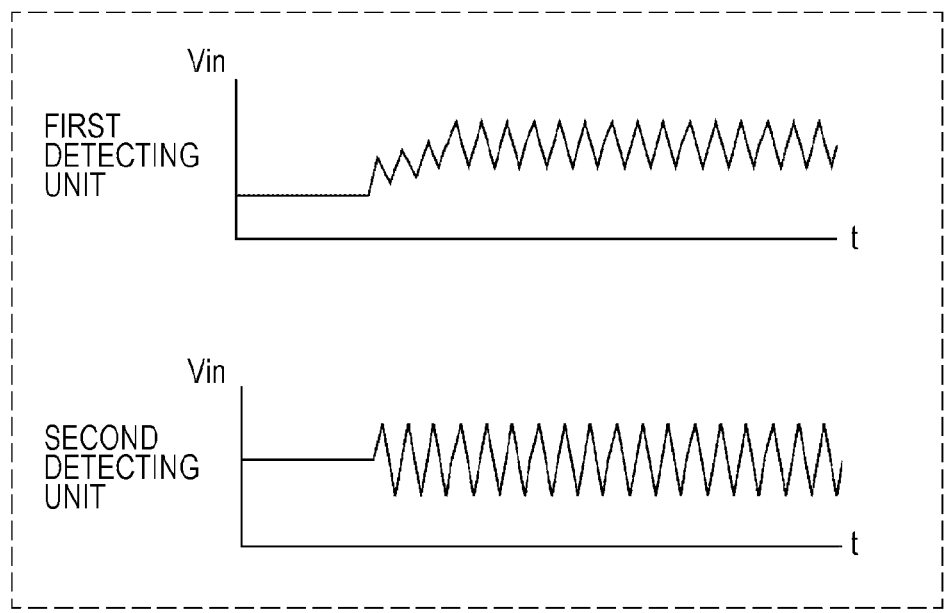
FIG. 3A is a diagram illustrating an example of detection with the first detecting unit and the second detecting unit according to an embodiment of the present disclosure.

In other words, when the power input Vcc (the positive electrode voltage of the battery 1) fluctuates with respect to the ground input Vss (the negative electrode voltage of the battery 1), fluctuations in the detected voltage input Vin are detected at both of the first detecting unit 11 and the second detecting unit 14, as shown in FIG. 3A.

Figure 3B:
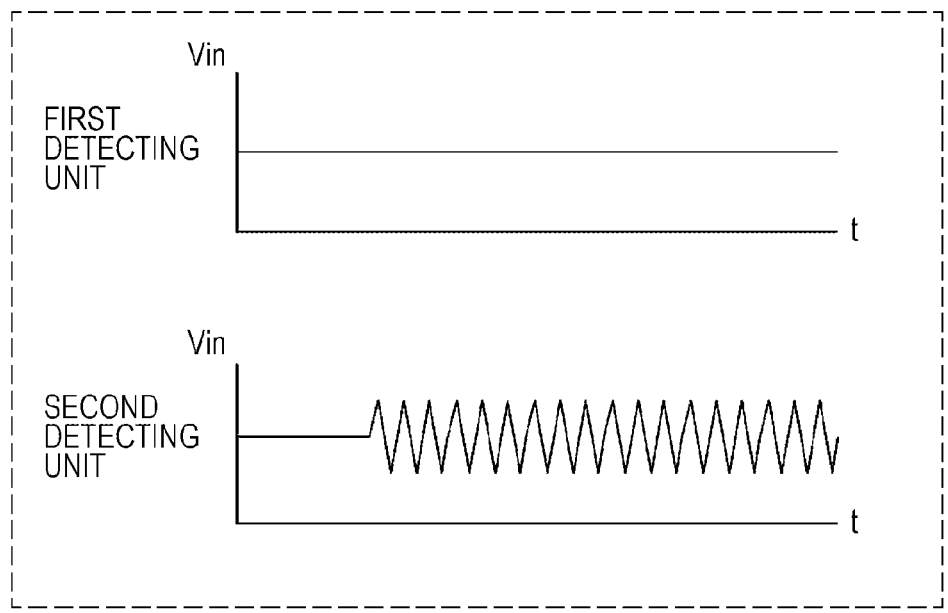
FIG. 3B is a diagram illustrating an example of detection with the first detecting unit and the second detecting unit according to an embodiment of the present disclosure.

Also when the power input Vcc (the positive electrode voltage of the battery 1) and the ground input Vss (the negative electrode voltage of the battery 1) fluctuate concurrently and similarly, fluctuations in the detected voltage input Vin are detected at one of the first detecting unit 1 and the second detecting unit 14, as shown in FIG. 3B, for example.

The fluctuation detecting unit 15 detects occurrence of fluctuations in supply voltage when at least one of the first detecting unit 11 or the second detecting unit 14 detects fluctuations in the detection voltage input Vin. Alternatively, the fluctuation detecting unit 15 may be configured to detect that the power input Vcc (the positive electrode voltage of the battery 1) fluctuates with respect to the ground input Vss (the negative electrode voltage of the battery 1) when both of the first detecting unit 11 and the second detecting unit 14 detect fluctuations in the detected voltage input Vin, and to detect that the supply input Vcc (the positive electrode voltage of the battery 1) and the ground input Vss (the negative electrode voltage of the battery 1) fluctuate concurrently and similarly when only one of the first detecting unit 11 or the second detecting unit 14 detects fluctuations in the detected voltage input Vin.

That is the supply-voltage-fluctuation detecting apparatus 10 according to an embodiment.

When the impedance between the first earth E1 and the second earth E2 is large, the supply-voltage-fluctuation detecting apparatus 10 may not include the impedance component 12, and the negative electrode of the second electrolytic capacitor 13 and the detected ground input Gin of the second detecting unit 14 may be connected only to the second earth E2, as shown in FIG. 4.

This configuration also allows fluctuations in the power input Vcc (the positive electrode voltage of the battery 1) with respect to the ground input Vss (the negative electrode voltage of the battery 1) and concurrent, similar fluctuations in the power input Vcc (the positive electrode voltage of the battery 1) and the ground input Vss (the negative electrode voltage of the battery 1) to be detected, as with the supply-voltage-fluctuation detecting apparatus 10 shown in FIG. 1.

Figure 5:
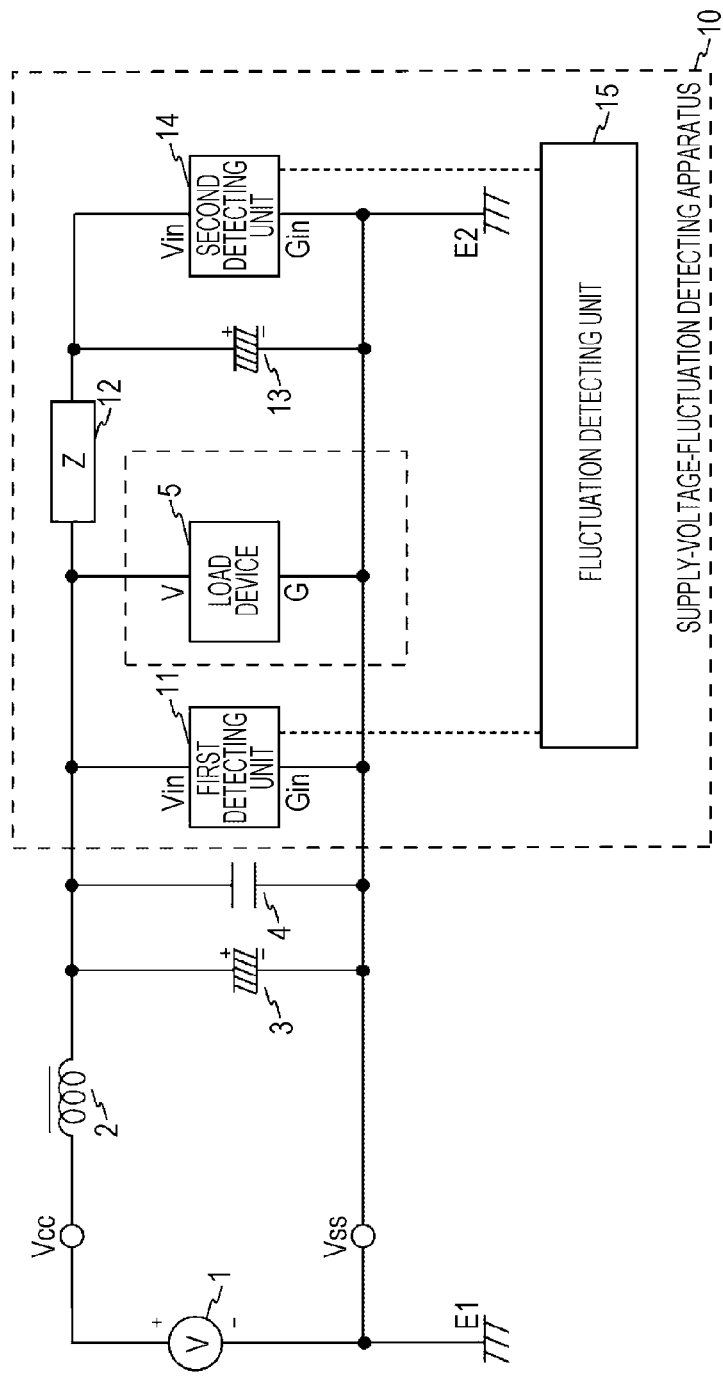
FIG. 5 is a block diagram illustrating a configuration of a supply-voltage-fluctuation detecting apparatus according to still another embodiment of the present disclosure.

In another embodiment, the supply-voltage-fluctuation detecting apparatus 10 includes the impedance component 12 between the detected voltage input Vin of the first detecting unit 11 and the detected voltage input Vin of the second detecting unit 14, instead of the impedance component 12 between the detected ground input Gin of the first detecting unit 11 and the detected ground input Gin of the second detecting unit 14, as shown in FIG. 5. As will be understood from comparison with the configuration in FIG. 1, this configuration provides detection of fluctuations in supply voltage from the battery 1 due to a delay in fluctuations in supply voltage due to the impedance component 12 and the second electrolytic capacitor 13 disposed in parallel to the second detecting unit 14 to be detected in different forms between the first detecting unit 11 and the second detecting unit 14, and provides detection of fluctuations in the power input Vcc (the positive electrode voltage of the battery 1) with respect to the ground input Vss (the negative electrode voltage of the battery 1) and also provides detection of concurrent, similar fluctuations in the power input Vcc (the positive electrode voltage of the battery 1) and the ground input Vss (the negative electrode voltage of the battery 1).

An application of the supply-voltage-fluctuation detecting apparatus 10 will be described hereinbelow.

Figure 6:
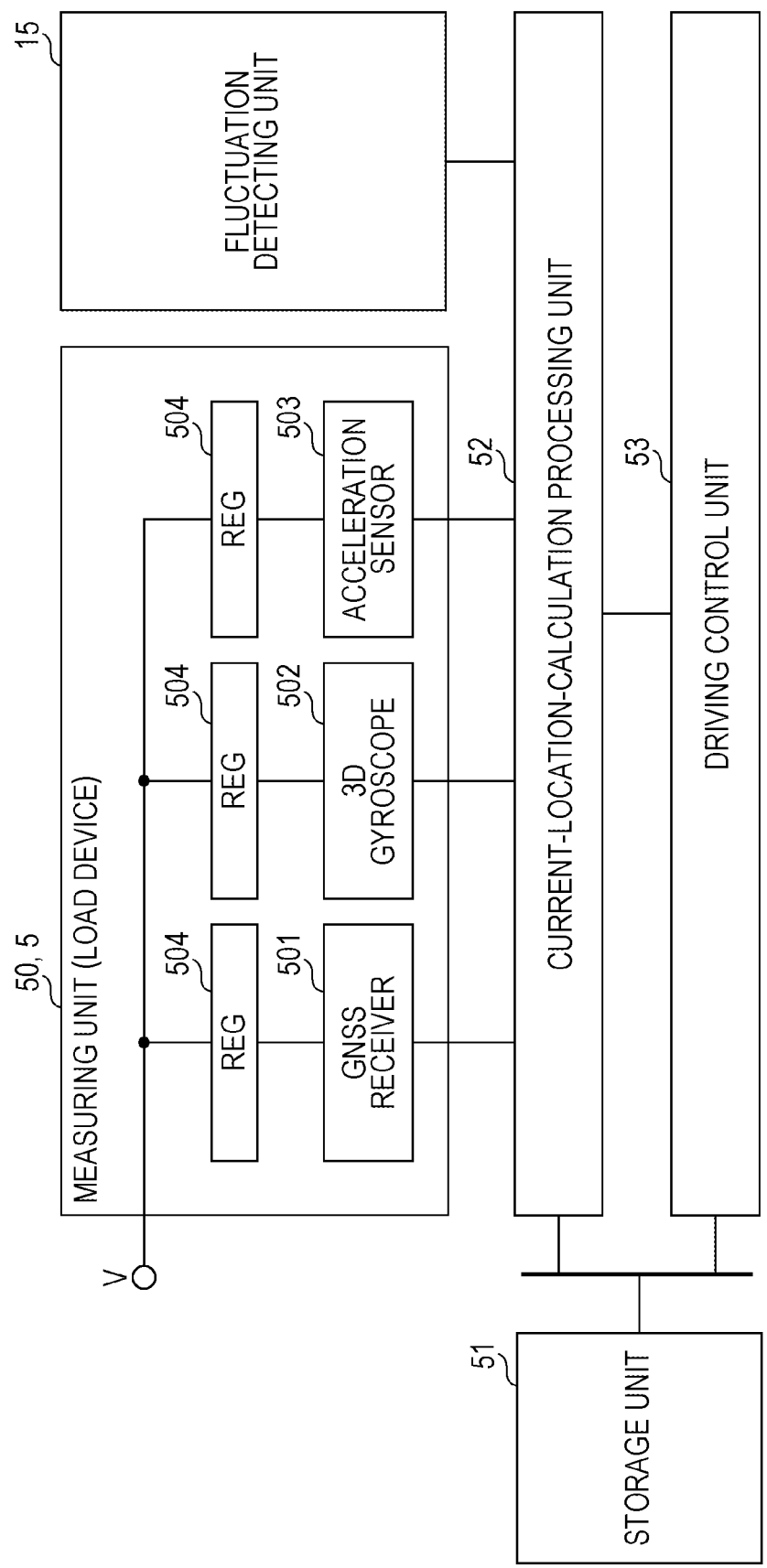
FIG. 6 is a block diagram illustrating a configuration of an automated driving system incorporating a supply-voltage-fluctuation detecting apparatus according to an embodiment of the present disclosure.

FIG. 6 illustrates a configuration of an automated automobile driving system incorporating the supply-voltage-fluctuation detecting apparatus 10.

As illustrated, the automated driving system includes a measuring unit 50 as the load unit 5 shown in FIGS. 1, 4, and 5. The automated driving system further includes a storage unit 51 storing map data and so on, a current-location-calculation processing unit 52, and a driving control unit 53.

The measuring unit 50 includes a global navigation satellite system (GNSS) receiver 501, which determines the position of the automobile by satellite positioning, a 3D gyroscope 502, an acceleration sensor 503, and a regulator

504 that generates operating voltage from a supply voltage input from the power input terminal V.

The current-location-calculation processing unit 52 calculates the most probable position and traveling direction of the automobile by matching the behavior of the automobile detected using the 3D gyroscope 502 that detects the three-dimensional angular velocity and the acceleration sensor 503 that measures the acceleration, the position of the automobile calculated from separately measured automobile speed by self-contained navigation, and the position of the automobile measured by satellite positioning using the GNSS receiver 501 to the map data stored in the storage unit 51, and outputs the position and direction to the driving control unit 53.

Considerable measurement errors occur in the 3D gyroscope 502 and the acceleration sensor 503, which are precise sensors, not only when the power input Vcc (the positive electrode voltage of the battery 1) fluctuates with respect to the ground input Vss (the negative electrode voltage of the battery 1) but also when the supply input Vcc (the positive electrode voltage of the battery 1) and the ground input Vss (the negative electrode voltage of the battery 1) fluctuate concurrently and similarly.

To address this, the current-location-calculation processing unit 52 calculates the current location and traveling direction of the automobile while setting the reliability of the measurement values from the 3D gyroscope 502 and the acceleration sensor 503 according to whether the fluctuation detecting unit 15 has detected fluctuations in supply voltage.

In other words, when the fluctuation detecting unit 15 detects fluctuations in supply voltage, the current-location-calculation processing unit 52 sets low reliability as the reliability of the measurement values from the 3D gyroscope 502 and the acceleration sensor 503. When low reliability is set, the current-location-calculation processing unit 52 calculates the current location and traveling direction without using the measurement values from the 3D gyroscope 502 and the acceleration sensor 503.

The driving control unit 53 performs automated automobile driving for controlling the rudder angle, the throttle angle, braking, and gearshift of the automobile on the basis of the current location and traveling direction of the automobile calculated by the current-location-calculation processing unit 52, the map data stored in the storage unit 51, a set route, and so on to drive the automobile forwards along the route.

It is therefore intended that the foregoing detailed description be regarded as illustrative rather than limiting, and that it be understood that it is the following claims, including all equivalents, that are intended to define the spirit and scope of this invention.

What is claimed is:

1. A supply-voltage-fluctuation detecting apparatus configured to detect fluctuations in voltage supplied from a power supply, the apparatus comprising:
    a first detecting unit comprising a positive input and a negative input, the first detecting unit being configured to detect fluctuations in voltage between the positive input and the negative input;
    a second detecting unit comprising a positive input and a negative input, the second detecting unit being configured to detect fluctuations in voltage between the positive input and the negative input;
    an impedance component;
    a capacitor configured to smooth the voltage between the positive input and the negative input of the second detecting unit; and
    a fluctuation detecting unit configured to, when at least one of the first detecting unit or the second detecting unit detects fluctuations in voltage, detect fluctuations in the supply voltage,
    wherein a positive electrode voltage supplied from the power supply is applied to the positive input of the first detecting unit and the positive input of the second detecting unit,
    wherein a negative electrode voltage supplied from the power supply is applied to the negative input of the first detecting unit, and
    wherein the negative input of the first detecting unit and the negative input of the second detecting unit are connected to each other via the impedance component.

2. The supply-voltage-fluctuation detecting apparatus according to claim 1,
    wherein a negative electrode of the power supply connects to a first grounding point,
    wherein the negative input of the second detecting unit connects to a second grounding point, and
    wherein the first grounding point and the second grounding point are separate different points of an electrical conductor.

3. The supply-voltage-fluctuation detecting apparatus according to claim 2, wherein the electrical conductor is a body of an automobile.

4. The supply-voltage-fluctuation detecting apparatus according to claim 1, wherein, when both of the first detecting unit and the second detecting unit detect fluctuations in voltage, the fluctuation detecting unit detects fluctuations in the positive electrode voltage supplied from the power supply with respect to the negative electrode voltage supplied from the power supply, and when only one of the first detecting unit or the second detecting unit detects fluctuations in voltage, the fluctuation detecting unit detects fluctuations in both of the positive electrode voltage supplied from the power supply and the negative electrode voltage supplied from the power supply.

5. The supply-voltage-fluctuation detecting apparatus according to claim 1, wherein a first end of the capacitor connects to the positive input of the second detecting unit, and
    wherein a second end of the capacitor connects to the negative input of the second detecting unit.

6. A processing system comprising:
    the supply-voltage-fluctuation detecting apparatus according to claim 1;
    a sensor configured to operate with power from a power supply; and
    a reliability calculating unit configured to calculate reliability of an output value from the sensor according whether the fluctuation detecting unit detects fluctuations in supply voltage.

7. A processing system mounted in an automobile, the processing system comprising:
    the supply-voltage-fluctuation detecting apparatus according to the claim 1;
    a sensor configured to operate with power from a power supply to detect behavior of the automobile;
    a reliability calculating unit configured to set low reliability to an output value from the sensor when fluctuations in supply voltage is detected according to whether the fluctuation detecting unit detects fluctuations in supply voltage; and
    a current-location calculating unit configured to calculate a current location of the automobile using an output value from the sensor to which low reliability is not set.

8. The processing system according to claim 7, further comprising:
  a driving control unit configured to perform automated driving of the automobile based on the current location calculated by the current-location calculating unit.

9. A supply-voltage-fluctuation detecting apparatus configured to detect fluctuations in voltage supplied from a power supply, the apparatus comprising:
  a first detecting unit comprising a positive input and a negative input, the first detecting unit being configured to detect fluctuations in voltage between the positive input and the negative input;
  a second detecting unit comprising a positive input and a negative input, the second detecting unit being configured to detect fluctuations in voltage between the positive input and the negative input;
  a capacitor configured to smooth the voltage between the positive input and the negative input of the second detecting unit; and
  a fluctuation detecting unit configured to, when at least one of the first detecting unit or the second detecting unit detects fluctuations in voltage, detect fluctuations in the supply voltage,
  wherein a positive electrode voltage supplied from the power supply is applied to the positive input of the first detecting unit and the positive input of the second detecting unit,
  wherein a negative electrode voltage supplied from the power supply is applied to the negative input of the first detecting unit,
  wherein the negative electrode of the supply voltage connects to a first grounding point,
  wherein the negative input of the second detecting unit connects to a second grounding point, and
  wherein the first grounding point and the second grounding point are separate different points of an electrical conductor having impedance.

10. A supply-voltage-fluctuation detecting apparatus configured to detect fluctuations in voltage supplied from a power supply, the apparatus comprising:
  a first detecting unit comprising a positive input and a negative input, the first detecting unit being configured to detect fluctuations in voltage between the positive input and the negative input;
  a second detecting unit comprising a positive input and a negative input, the second detecting unit being configured to detect fluctuations in voltage between the positive input and the negative input;
  an impedance component;
  a capacitor configured to smooth the voltage between the positive input and the negative input of the second detecting unit; and
  a fluctuation detecting unit configured to, when at least one of the first detecting unit or the second detecting unit detects fluctuations in voltage, detect fluctuations in the supply voltage,
  wherein a negative electrode voltage supplied from the power supply is applied to the negative input of the first detecting unit and the negative input of the second detecting unit,
  wherein a positive electrode voltage supplied from the power supply is applied to the positive input of the first detecting unit, and
  wherein the positive input of the first detecting unit and the positive input of the second detecting unit are connected to each other via the impedance component.

* * * * *